United States Patent [19]

Holt

[11] 4,414,741
[45] Nov. 15, 1983

[54] PROCESS FOR INTERCONNECTING COMPONENTS ON A PCB

[75] Inventor: Richard C. Holt, Fairhaven, Mass.

[73] Assignee: Augat Inc., Mansfield, Mass.

[21] Appl. No.: 266,620

[22] Filed: May 22, 1981

[51] Int. Cl.³ .............................................. H05K 3/30
[52] U.S. Cl. ...................................... 29/837; 174/68.5
[58] Field of Search .......................... 29/850, 836, 837; 174/68.5

[56] References Cited

U.S. PATENT DOCUMENTS

| | | | |
|---|---|---|---|
| 3,353,263 | 11/1967 | Helms | 29/850 X |
| 3,567,999 | 3/1971 | larson | 174/68.5 X |
| 3,644,792 | 2/1972 | Fields | 174/68.5 X |
| 3,701,838 | 10/1972 | Olney, Jr. | 174/68.5 |
| 3,786,172 | 1/1974 | Conley | 174/68.5 |
| 3,842,190 | 10/1974 | Towell | 174/68.5 |
| 3,981,076 | 9/1976 | Nicolas | 29/836 |

*Primary Examiner*—Howard N. Goldberg
*Assistant Examiner*—Carl J. Arbes
*Attorney, Agent, or Firm*—Weingarten, Schurgin, Gagnebin & Hayes

[57] ABSTRACT

A printed circuit board, and method for its fabrication, wherein a first side of the board includes a network of interconnection wires channeled generally in groups along pathways apart from the region for the installation of electrical components and the board apertures through which their associated leads pass. Th network of wires is encapsulated below a plastic sheet adhered to the surface ofthe circuit board after wiring. The electrical components are subsequently installed from the same side as the network of wiring and are electrically connected into the wiring network by wave soldering applied to the opposite board surface. Such a printed circuit board permits the doubly efficient use of automated interconnect wiring in combination with component installation by wave soldering. The network of wiring is typically adhered to the surface by a layer of sheet adhesive applied under elevated temperature and pressure. The adhering of the interconnect network keeps individual wires from interfering with the installation of circuit components and makes possible the location of both components and interconnect wiring on the same circuit board side. This in turn frees the opposite side for mass installation techniques such as wave soldering.

8 Claims, 12 Drawing Figures

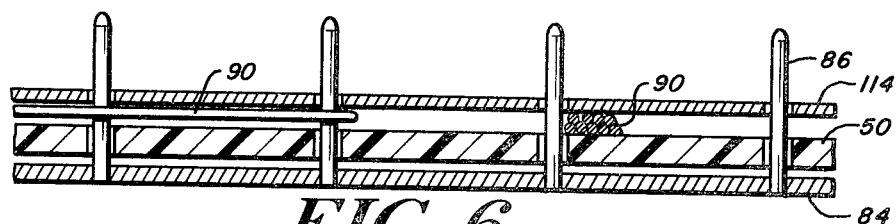
FIG. 6
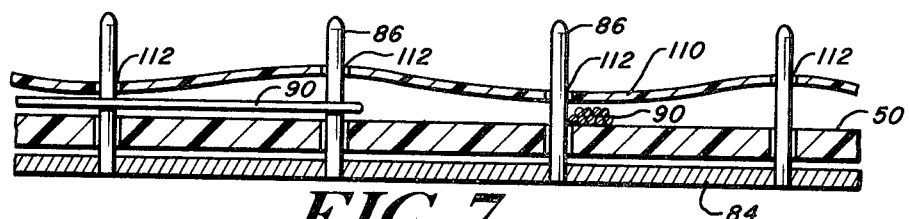
FIG. 7
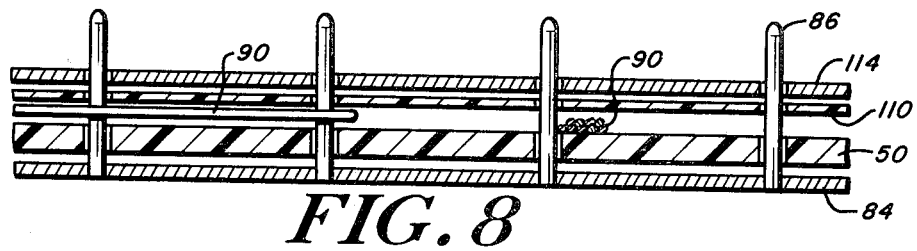
FIG. 8
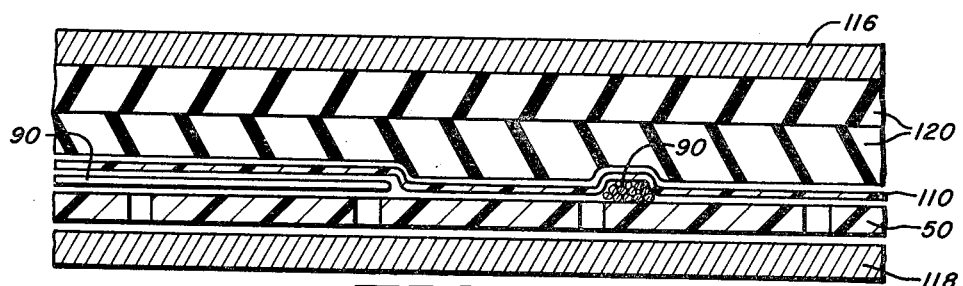
FIG. 9
FIG. 10
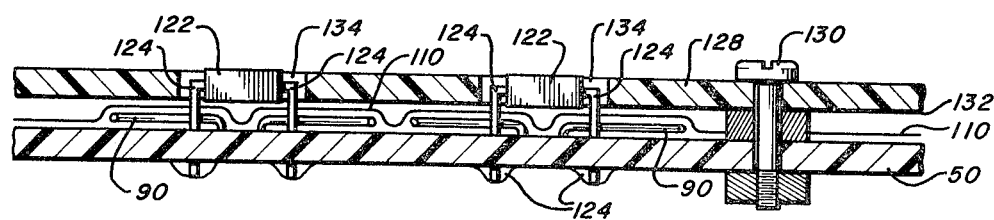

PROCESS FOR INTERCONNECTING COMPONENTS ON A PCB

FIELD OF THE INVENTION

The present invention relates to printed circuit boards.

BACKGROUND OF THE INVENTION

The technique chosen to manufacture a multi-component printed circuit board such as those typically found in computer and similar high density digital circuit applications, depends upon the number of such boards to be generated in a single production run. Where only a few boards are intended, the technique of wire-wrapping is typically employed. Here the electrical leads of components, such as individual or integrated circuit elements, are installed into sockets which have wiring pins or leads passing through apertures in a printed circit board to the opposite side. The pins are subsequently interconnected by wire-wrap techniques. For very large numbers of production runs, into the hundreds or more, multi-layer board techniques are typically employed. Here, despite the high density of component connections, the number of lead crossings can, by careful planning, be reduced to a number compatible with the use of a plurality of, for example ten, layers of circuit board wiring patterns, each insulated from the other and accessible from one or the other circit board sides by through-plated connections.

There exists a large number of circuit board applications for which the production numbers fall between these two extremes. One previous technique for producing printed circuit boards in this middle area includes an automated wiring technique in which the leads of components to be installed are typically shortened and bent to permit them to be soldered to respective terminal pads on one surface of a printed circuit board. Through-plating techniques provide electrical connection from these printed circuit pads on the component side of the circuit board to terminal pads on the opposite side of the circuit board. These circuit pads, on the opposite side of the circuit board, are then typically interconnected in the desired pattern using an automated interconnect system. One such system is the BONDEX system of the assignee of the present application, Augat, Inc., Mansfield, Mass. This system is represented in U.S. Pat. No. 3,840,169. Other automatic wiring systems are known.

In this prior technique the components and wiring are located on opposite sides of the printed circuit board in order to prevent the wiring network from interfering with the installation and placement of the electrical components, and vice versa. Wave soldering is not applicable to such circuit boards because with the components located on one side of the circuit board and the wiring done on the other side, there is no free side that can be wave soldered. Great efficiency is produced by the automated wiring technique, however, even though the component installation on the opposite side of the circuit board typically proceeds by more time consuming individual connection soldering operations.

SUMMARY OF THE INVENTION

In accordance with the teaching of the present invention, a printed circuit board technique permits placement of both board electrical components and automatically applied, adhered interconnect wiring on the same board side, freeing the opposite side for single step electrical interconnection and installation of components such as by wave soldering. In this manner the dual efficiency of automated wiring and wave soldering technology can be utilized to produce highly efficient manufacture of high component density printed circuit boards in production runs for which the advantages of multi-layer technology are not warranted and for which wire-wrap technology has proven undesirably costly.

In practicing the present invention, a printed circuit board interconnect wiring network is provided by routing the individual wires through channels or pathways defined by a plurality of pins which isolate the channels from the regions of component installation, and in particular the apertures through which their electrical leads pass. With the pins in place, the network of wires are covered and secured in bundles or groups to the printed circuit board, preferably by the application of a layer of thermo-plastic which is pressure and temperature adhered onto the circuit board and wiring network. This encapsulates the wiring network in the pattern in which it is originally installed as defined by the pathways around the pins. When the pins are subsequently removed, the wiring network is firmly adhered in position on the board and all network wires are prevented from straying into the component placement regions and potentially blocking the component lead insertion apertures.

Subsequently, the electrical components are installed on the same side of the circuit board containing the covered network of interconnect wires, their leads passing through the board and protruding from the opposite side in a region of conductive pads. Wave soldering of the opposite side of the circuit board connects the components into the network of wires on the first side, in the desired pattern.

Subsequently, an electrically conductive layer may be applied over the pattern of bonded interconnect wires and surrounding the installed components to provide shielding.

Additionally, a pattern of electrical conductors applied on the surface of the printed circuit board holding the components and wiring network may make provision for terminal pads to be located within the region of component installation to carry both ground and circuit voltage potentials close to wiring sites.

DESCRIPTION OF THE DRAWING

These and other features of the present invention are more fully setforth below in the solely exemplary detailed description of the invention and in the accompanying drawings of which:

FIG. 6 shows the step of nesting the installed wires down on the circuit board;

FIG. 7 is a cross-sectional view of a circuit board being manufactured in accordance with the present invention the step of FIG. 6 and showing the step of applying an adhesive plastic sheet over a fully wired board;

FIG. 8 illustrates the board of FIG. 7 having the sheet tacked into position to temporarily hold the network of automatically installed wires in place;

FIG. 9 illustrates pressure and temperature adhering of the adhesive sheet of FIG. 8 into permanent position;

FIG. 10 illustrates, still in cross-section, the installation of components, their electrical connection into the circuit board wiring network by wave soldering techniques and the installation of an electrically conducting layer over the pattern of bonded wires and around the installed components.

DETAILED DESCRIPTION

The present invention contemplates a circuit board having both electrical components and automatically installed interconnect wiring applied to the same side of the circuit board and in which the network of interconnection wires is adhered in bundles to the circuit board to prevent interference with the placement and installation of individual board components. The board components are then electrically connected and physically secured by a high efficiency, or a single step, process such as wave soldering, applied to the opposite side of the circuit board from that having the components and wiring.

Figure 1:
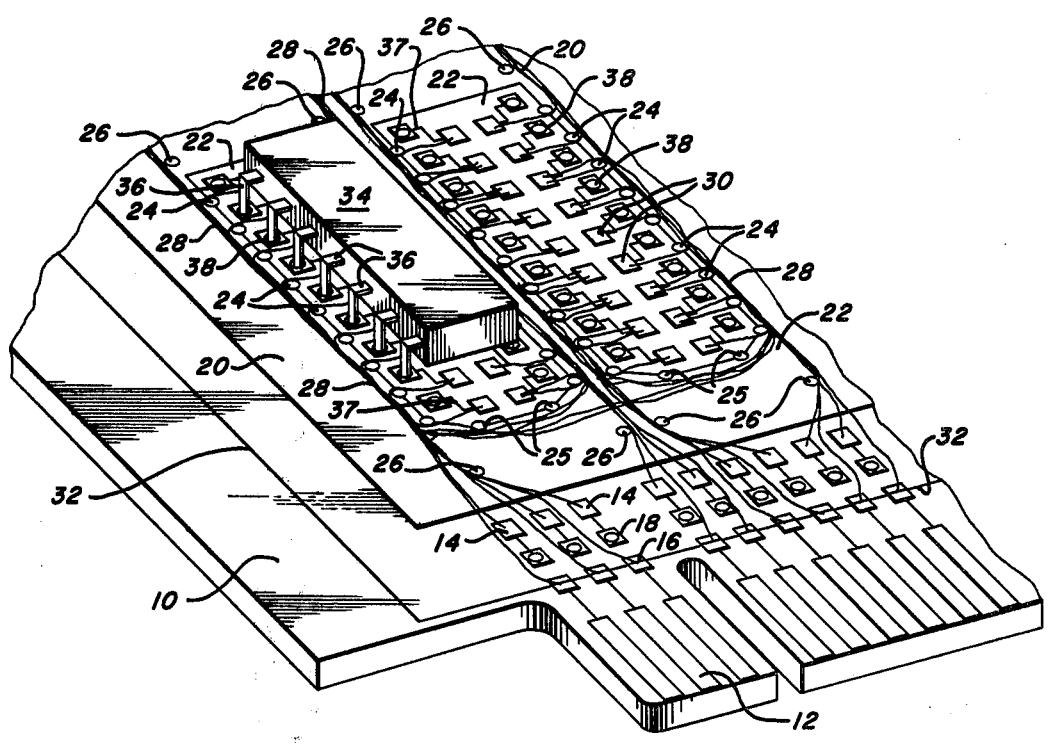
FIG. 1 is a perspective, partially cut-away view of a portion of a circuit board in accordance with the present invention.

Such a circuit board is illustrated in FIG. 1. As shown there, a portion of a circuit board 10 has conventional input and output edge contacts 12 which are connected to terminal pads 16. Pads 14 are connected via through-plate holes 18 to similar contacts on the opposite side of the board 10.

A metal layer 20 is provided on the board to accomodate ground or operating voltage potentials. The metal layer 20 is apertured in regions 22, typically bordered by a series of holes 24. Additional end holes 25 and 26, used with holes 24 for a purpose to be described below, are provided through the board.

Wiring for interconnecting the various terminal pads on a predetermined basis is provided by a network 28 of wiring which proceeds along pathways between the holes 24, 25 and 28 changing direction at locations defined by these holes as will be more fully described below. Holes 24, 25 and 26 are not through-plated. The individual wires in the network 28 make connection at the circuit pads 14 or 16, or at circuit pads 30 which are included within the region 22 of circuit board exposed through the metal layer 20.

Over substantially the entire board 10, including the network 28 of wiring, is an adhesive film 32, typically a sheet of pressure and temperatures setting plastic which is secured to the circuit board, encapsulating the network 28 of wires in groups and holding them firmly onto the circuit board.

Shown installed on the board 10 is a circuit component 34, typically a form of integrated circuit having a plurality of electrical connection leads 36 which are installed in plated through apertures in circuit pads 38 and wave soldered into electrical connection with the pads 38 at contacts on the opposite side of the circuit board. The circuit pads 38 provide electrical connection from the leads 36, by plated on connectors 37, to the corresponding terminal pads 30 from which the wiring in the network 28 connects them to other connections of the same or different electrical component or to input and output contacts 12.

Figure 2:
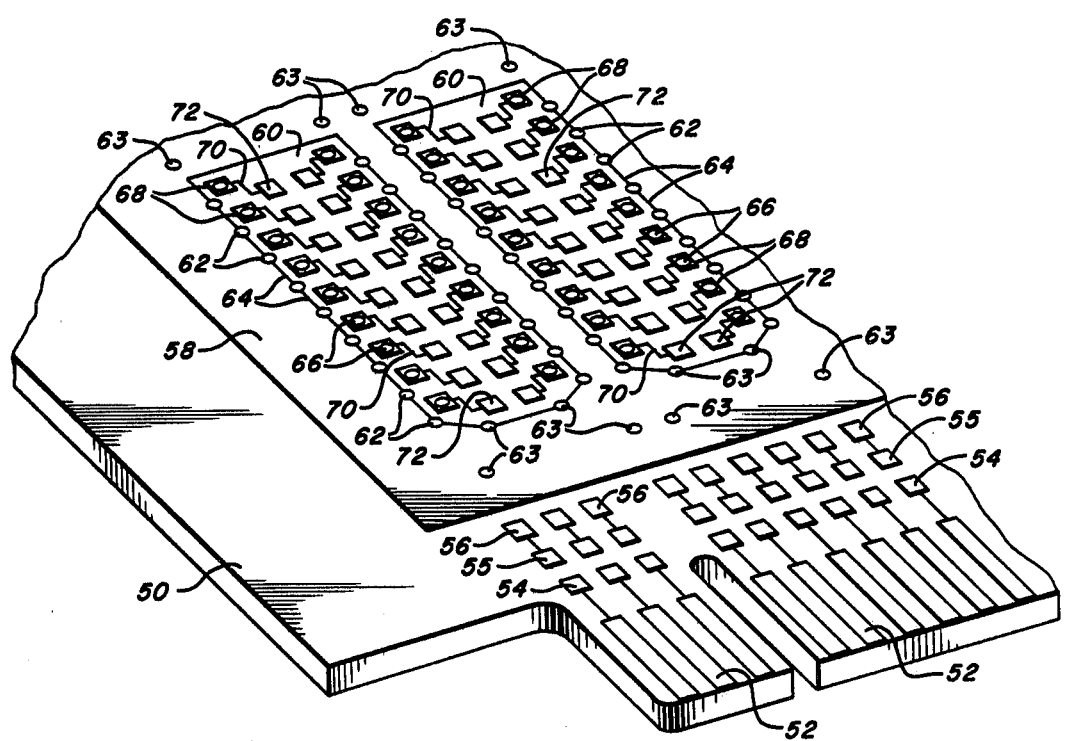
FIG. 2 is a perspective view of a portion of a circuit board for use in the present invention before installation components.

With reference now to FIG. 2, a perspective of a first side of a circuit board is shown at the beginning of processing to achieve the final result of FIG. 1. In FIG. 2, a circuit board 50 is plated with a row of edge contacts 52 adapted to provide electrical connection onto the board from a plug in which it is installed in use. The contacts 52 are connected to pads 54 on the shown side. Similar contacts on the opposite side are typically bridged from that opposite side of the board through a set of through-plated holes 55 to connection pads 56. A metal layer 58 is provided on the shown surface of the circuit board and apertured in regions 60 to expose the underlying insulating board material. The apertures 60 are boarded by a ring of through-board holes 62 which are typically set at the edge 64 of the metal layer 58. End holes 63 corresponding to the holes 25 and 26 in FIG. 1 are provided as well. Additional holes 66 within the region 60 define places for the insertion of the electrical connection leads of components, in this case an integrated circuit duel-in-line package. Holes 66 are through-plated, while holes 62 and 63 are not. Surrounding the holes 66 are plated regions 68 which connect, through plated strips 70, to terminal pads 72. For purposes of bringing the electrical potential provided on the metal layer 58 into the integrated circuit on desired pin designations, the metal layer 58 is typically formed to include one of the regions 68 around a hole 66 shown here solely by way of example at a corner of the region 60.

Figure 3:
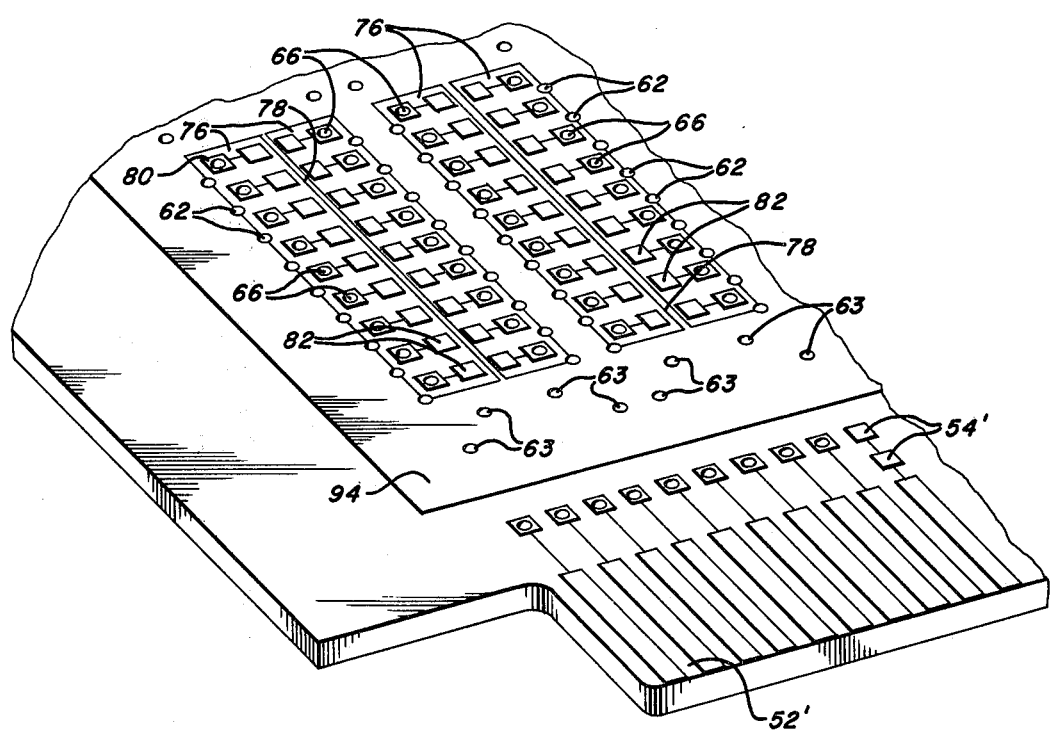
FIG. 3 is a view of the opposite side of the FIG. 2 circuit board.

The opposite side of the board 50, illustrated in FIG. 2, is shown in FIG. 3. This second side of board 50 typically includes similar edge contacts 52' which are joined by through-plated holes 55 to the reverse side of the board 50. In addition, a conductive layer 74, typically isolated from the conductive layer 58 on the opposite side, is provided in a similar pattern which leaves a set of unplated regions 76 bordered by the holes 62. The conductive layer 74 continues through the region 76 as a thin strip 78, as illustrated. Small conductive zones 80 surround the holes 66 and are connected to adjacent connector pads 82 for use as test points or for making wiring changes after wave soldering.

Figure 4:
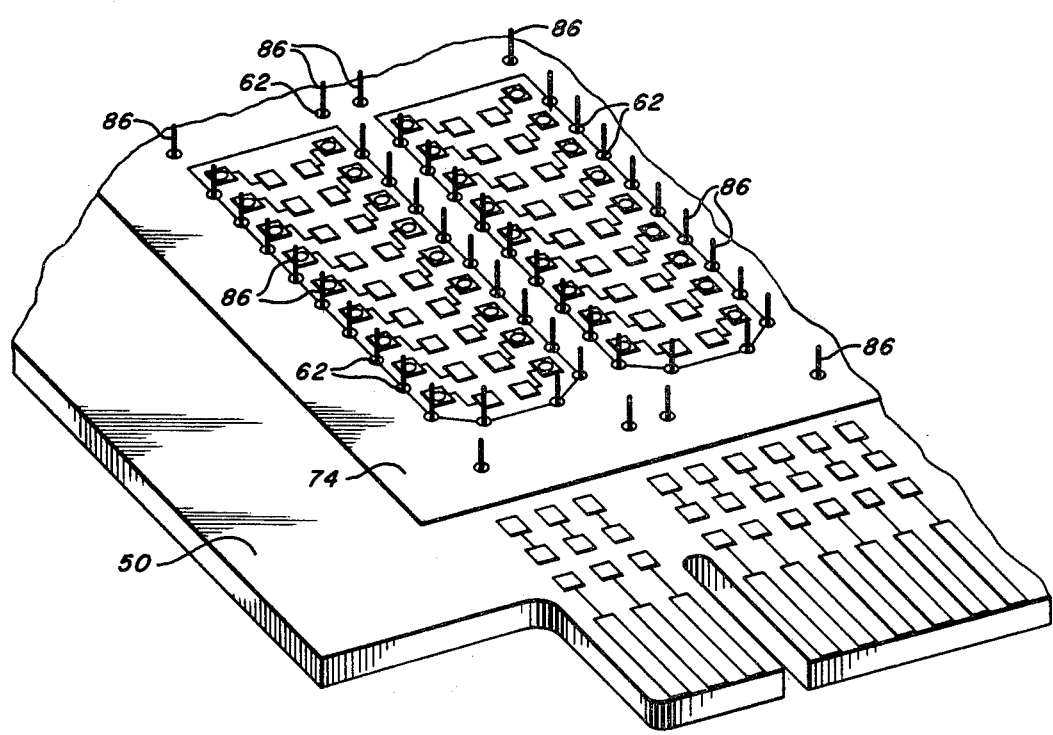
FIG. 4 is a view of the circuit board of FIG. 2 showing the step of installing a pattern of pins for use in automated wiring of the circuit board on a first surface.
Figure 4A:
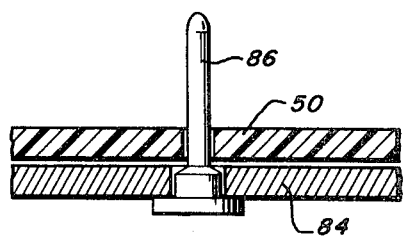
FIG. 4A is a cross-sectional view of a preferred pin.

In the process of fabricating a completely wired circuit board with components installed, the next step consists of placing a set of pins through the apertures 62 as illustrated in FIG. 4. For this purpose a plate 84 (shown in subsequent FIG. 4A) is provided with a pattern of upwardly projecting pins 86 in locations aligned with all of the apertures 62 in the board 50. The pins are more fully illustrated in FIG. 4A and are shown to include an upper portion extending approximately 0.2 in above the board 50.

Figure 5:
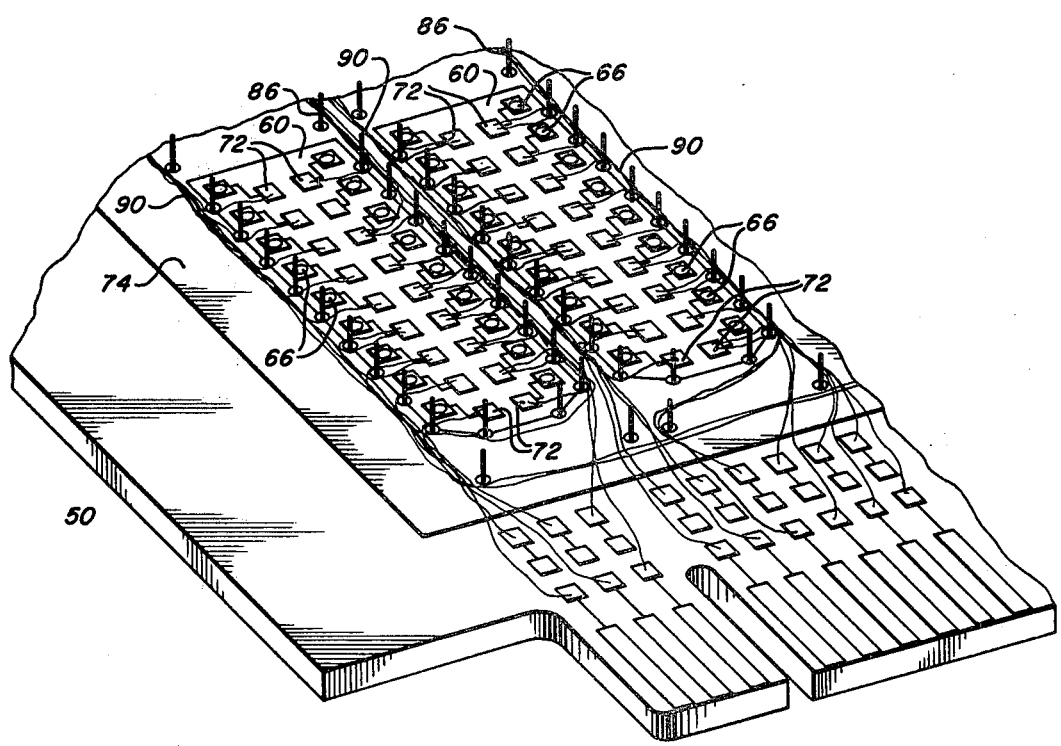
FIG. 5 shows the circuit board of FIG. 4 showing the step of automated wiring partially accomplished.

Wiring in accordance with this technique proceeds, as partially illustrated in FIG. 5, by routing wires 90 along pathways, which generally are defined by the pins 86 as channels which avoid the regions 60 in which components are to be placed and in particular avoids the holes 66 through which the connector leads on the components are installed through the circuit board 50.

The wires 90 typically include a thermally strippable insulation. A tool is provided in the BONDEX system to strip the insulation at the lead end once the tool has directed it between and around the pins 86 to one of the terminal pads 72. At this point the tool solders the stripped wire to the pad 72 and cleaves it on the opposite side, thereby freeing the wire for installation between another set of terminal pads 72. In this manner all of the wires 90 are kept away from the region 60 and the holes 66, being routed, instead, around and therefore tracing the diameter outline of the holes 62 through which the pins 86 are inserted. Typically wiring is done over ground potential so layer 74 is normally grounded.

Figure 5A:
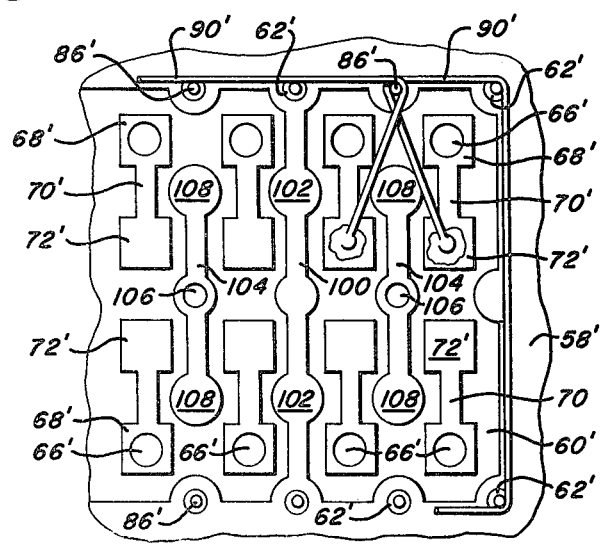
FIG. 5A is a detailed view of a portion of an modified preferred circuit board showing it construction at a point roughly corresponding to FIG. 5.

A modified, and preferred circuit board configuration for terminal pads within the region 60 is illustrated in FIG. 5A in which a region 60' surrounded by a metal layer 58' is shown in expanded plan view. Holes 62' border the region 60' and have a set of pins 86' inserted therethrough. Holes 66' are included within a small conductive pad region 68'. A direct plated connection 70' to a terminal pad 72' is provided in a straight line as opposed to the zigzag shape of the connection 70 in the previous embodiment of FIG. 5. Wires 90' are lead to the terminal pads 72' by routing them first past the next pin, and then back at an acute angle to the intended pad 72' as illustrated in FIG. 5A.

This pattern permits isolation os the wires 90' from the region of the apertures 66' at the same time providing a straight line central region between the sets of apertures 66', conductive regions 68', conductive strips 70', and terminal pads 72'. These regions are illustrated in FIG. 5A to have conductive strips of alternating character such as strips 100 which connect the metal layer 58' at opposite hole 62' locations and thereby providing access throughout the region 60' to the voltage carried by the conductive layer 58'. The conductor strip 100 typically includes enlarged terminal pad regions 102 to facilitate wire bonding from the strips 109 to adjacent terminal pads 72 as desired.

Alternating with the strips 100 are strips 104 of a similar nature except that they are terminated short of the locations of holes 62', thereby avoiding electrical connection to the conductive layer 58'. Centrally in the plated conductive strips 104 are through-plated holes 106 which connect the strips 104 to voltage strips on the opposite side of the circuit board such as the counter part of strip 78 (FIG. 3). In this manner the electrical potential of that layer is provided via the through-plated hole 106 to the plated terminal steip 104. Terminal pad regions 108 of enlarged diameter are provided in order to facilitate wire connection by the automated wiring system from such regions to desired terminal pads 74'.

The configuration of FIG. 5A permits closer spacing of regions 60' by eliminating the outlying set of pads 72 and eliminating the need for holes 63 (holes 25 and 26 in FIG. 1).

The board initially wired has the wires 90 drawn taught around pins 86 or 86' at some elevated location thereon. In FIG. 6, a cross-sectional view, a plate 114 is urged down over the board 50 to nestle the wires 90 down onto the top surface of board 50.

The next step, illustrated in FIG. 7, shows the circuit board 50 and pin holding plate 84 in similar cross-sectional view, with a thin plastic sheet or film 110 being lowered over the circuit board 50. The sheet 110 has been apertured in locations 112 corresponding to the location of the pins 86 or 86' in order that it may fit over the pins and be pressed snuggly on top of the circuit board 50 and installed wires 90. Layer 110 is also apertured at the locations of holes 66.

The plastic sheet 110 may be of many types though it is preferable that it be a pressure and thermal sensitive layer which typically is slightly adhesive on its two sides and is therefore with strippable paper layers on each side. The strippable layer closest to the circuit board 50 is removed prior to the insertion as illustrated in FIG. 7. The plastic portion of layer 10 may be 0.004 inches thick.

As shown in FIG. 8, the layer 110 is preferably urged down into contact with the board 50 and wires 90 using an appropriately apertured rigid plate 114 which may be of metal or otherwise as desired. Manually applied pressure is sufficient to effectively "tack" the layer 110 into position on the board securing the wires 90 into position temporarily.

In FIG. 9, this temporarily secured set of layers is subject to high pressure bonding using a press in which the arrangement of FIG. 8, after removal of pins 86, plate 84 and plate 114, is pressed between press plates 116 and 118. A set of rubber layers 120 totaling for example, 0.080 in. in thickness is provided on the upper surface between the plate 116 and the film 110. Layers 120 are significantly thicker than the height of bundled wires 90. The combination of rubber layers 120, in conjunction with pressure and an elevated temperature of 300° F. for a short interval effectively flows the layer 110 into and around all crevices on board 50 and the network of wires 90. When the presure and temperatures are returned to normal, the layer 110 provides a secure bonding of the network of wires 90 to the circuit board 50. At this point the plastic layer 110 may be chemically stripped if desired. The layer 110 and the board are subject to a curing cycle of 270° F. for about an hour which permanently adheres layer 110. The top paper lining is removed before curing.

Thereafter, and as illustrated in FIG. 10, various components 122, such as individual R-L-C elements or dual-in-line integrated circuit modules are installed on the board 50 from the same side that contains the network of wires 90 covered by the layer 110. In typical fashion, leads 124 of the elements 122 are installed through the holes 66 to protrude slightly through the other side where they are wave soldered into place around the surrounding metalized layer of those holes. The process of this invention has left that side of the board completely free for efficient single step bonding such as by the wave soldering process noted above. It should be understood that the term component is used generically to include, electrical elements, sockets, or their combinations.

It is optionally possible to provide a conductive shield layer over the wired side of board 50 by installing a plate 128, such as by bolts 130, and having a plated-on conductive layer 132 which can be secured adjacent to the network of wires 90. The plate 128 is typically apertured in regions 134 to accomodate the components 122, allowing the plate 128 to set close to the printed circuit board 50.

The above described printed circuit board and the process for its manufacture provide for a board which is efficiently wired using automated wiring technology while at the same time permitting rapid, single step component installation such as by the wave soldering technique. To achieve these dual efficiencies, the board includes both the components and the wiring network on the same side with the wiring network covered and permanently adhere to the board by, for example, the application of a pressure bonded plastic sheet layer. It should be noted that other specific means for accomplishing the invention may be practiced within the scope as solely limited in accordance with the following claims.

What is claimed is:

1. A process for installing and interconnecting components on a printed circuit board comprising:

interconnecting terminal pads on a single printed circuit board side with a network of wires routed in groups around selected upwardly projecting removable guide pins along pathways which exclude portions of the printed circuit board apertured to receive electrical leads from printed circuit board components;

removing said removable guide pins;

covering the network of interconnection wiring thus formed with a layer of material to adhere them to the circuit board;

installing electrical components on said circuit board on the same side as the covered network of interconnecting wires with the electrical leads therefrom protruding the circuit board apertures to the opposite side thereof;

applying an electrical interconnection medium to the side of said circuit board opposite to the one having said network of wires to provide electrical connection of the leads from said components to said terminal pads through said apertures.

2. The process of claim 1 wherein said interconnecting step includes:

establishing a pattern of pins surrounding the apertures and regions for installation of components on said circuit board;

routing said interconnecting wires in groups in pathways around said pins to avoid crossing said apertures and regions for the installation of components.

3. The process of claim 2 wherein:

said printed circuit board terminal pads are included within said regions and surrounded by said pins;

said routing step includes routing a wire from said pathways to one said terminal pad by passing around a pin beyond the pad and returning the wiring at an acute angle toward said pad.

4. The process of claim 1 wherein said interconnect step includes the step of applying wire having thermally strippable insulation thereon using an automated wiring process.

5. The process of claim 1 wherein said covering step includes the step of applying an adhesive film over said printed circuit board on the side having said network of wires to adhere said wires to said circuit board.

6. The process of claim 5 wherein said covering step includes:

the step of tacking said film to said circuit board;

applying to said film elevated pressure and temperature to cause said sheet material to flow around said network of wires and encapuslate them on said board.

7. The process of claim 1 wherein said step of applying an electrical interconnection medium comprises the step of wave soldering said printed circuit board on the side opposite to the side having said network of wires.

8. The process of claim 1 further including the step of installing an electrically conductive layer on top of said network of wires and around the installed electrical components.

* * * * *